(12) United States Patent
Watson

(10) Patent No.: US 7,683,506 B2
(45) Date of Patent: Mar. 23, 2010

(54) CI-CORE ACTUATOR FOR LONG TRAVEL IN A TRANSVERSE DIRECTION

(75) Inventor: Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 1070 days.

(21) Appl. No.: 11/306,134

(22) Filed: Dec. 16, 2005

(65) Prior Publication Data
US 2008/0296983 A1 Dec. 4, 2008

(51) Int. Cl.
H02K 41/02 (2006.01)

(52) U.S. Cl. .............. 310/12.01; 310/12.06; 310/12.09; 310/12.15; 310/90.5; 104/281

(58) Field of Classification Search ............... 310/12, 310/90.5, 13; 104/281
See application file for complete search history.

(56) References Cited

U.S. PATENT DOCUMENTS

| | | | | |
|---|---|---|---|---|
| 3,770,995 A | * | 11/1973 | Eastham et al. | 104/294 |
| 3,780,668 A | * | 12/1973 | Schwarzler et al. | 104/286 |
| RE28,161 E | * | 9/1974 | Bolton | 310/13 |
| 3,836,799 A | * | 9/1974 | Eastham et al. | 310/13 |
| 4,049,983 A | * | 9/1977 | Attwood et al. | 310/13 |
| 4,216,397 A | * | 8/1980 | Popov et al. | 310/13 |
| 4,239,997 A | * | 12/1980 | Popov et al. | 310/13 |
| 4,241,268 A | * | 12/1980 | Popov et al. | 310/13 |
| 4,254,349 A | * | 3/1981 | Bocharov et al. | 310/13 |
| 4,258,278 A | * | 3/1981 | Popov et al. | 310/13 |
| 5,157,296 A | | 10/1992 | Trumper | |
| 5,379,864 A | * | 1/1995 | Colby | 187/393 |
| 5,625,240 A | * | 4/1997 | Bernus | 310/90.5 |
| 5,929,541 A | * | 7/1999 | Naito et al. | 310/12 |
| 6,066,998 A | * | 5/2000 | Trumper et al. | 335/229 |
| 6,069,417 A | * | 5/2000 | Yuan et al. | 310/12 |
| 6,541,880 B2 | * | 4/2003 | Okada et al. | 310/12 |
| 6,750,625 B2 | | 6/2004 | Binnard et al. | |
| 6,876,108 B2 | * | 4/2005 | Maki et al. | 310/12 |

* cited by examiner

Primary Examiner—Burton Mullins
(74) Attorney, Agent, or Firm—T & I Law Group, PC (57) ABSTRACT

Methods and apparatus for providing relatively long travel in a transverse direction for a magnetic levitation stage apparatus are disclosed. According to one aspect of the present invention, a linear actuator includes a first core, a second core, and at least one coil wrapped around the first core. The first core includes a body portion and a plurality of rails. The body portion has a first axis and a second axis, and the rails have longitudinal axes that are perpendicular to the first axis and parallel to the second axis. The dimensions of the rails along the longitudinal axes are substantially larger than a dimension of the body portion along the second axis. The second core has a third axis that is oriented perpendicularly to the longitudinal axes and to the second axis, and is levitated relative to the first core when a current is provided through the coil.

8 Claims, 10 Drawing Sheets

CI-CORE ACTUATOR FOR LONG TRAVEL IN A TRANSVERSE DIRECTION

BACKGROUND OF THE INVENTION

1. Field of Invention

The present invention relates generally to semiconductor processing equipment. More particularly, the present invention relates to a CI-core or an EI-core actuator which enables travel to efficiently occur in a transverse direction.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by excessive heat or weight, the integrity of a device formed using the precision instrument may be compromised.

Magnetic levitation stage assemblies are often used in photolithography processes to support a wafer that is being scanned. In magnetic levitation stage assemblies, magnetic actuators are used to allow a stage, e.g., a fine stage, to effectively undergo non-contact positioning. Such magnetic actuators produce a suspension or levitation force which allows a stage to be scanned or otherwise positioned without the stage having to substantially contact any surface.

The use of a magnetic levitation stage allows the weight associated with the stage to be substantially supported without requiring a relatively large amount of energy or current, and also allows the stage to be accurately positioned. An example of a magnetic levitation stage is described in co-pending U.S. patent application Ser. No. 10/272,930, filed Oct. 18, 2002, which is incorporated herein by reference in its entirety.

Figure 1A:
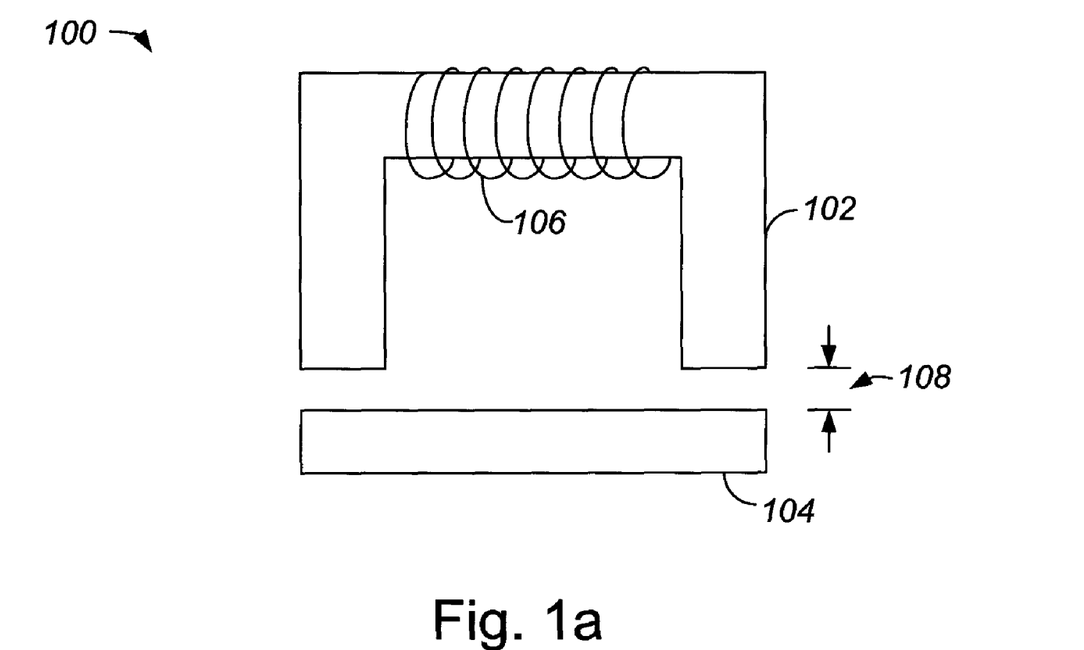
FIG. 1a is a diagrammatic representation of a CI-core actuator with a single coil which is capable of generating a force that may be used as a magnetic levitation force.

FIG. 1a is a diagrammatic representation of a CI-core actuator with a single coil which is capable of generating a force that may be used as a magnetic levitation force. A CI-core actuator 100 includes a C-core 102 and an I-core 104 which are separated by a gap 108. A coil 106 is substantially wound around a top-portion of C-core 102. If coil 106 is provided with current, coil 106 and the top-portion of C-core 102 form an electromagnet. When gap 108 is relatively small, as for example less than or equal to approximately one millimeter (mm) in size, CI-core actuator 100 may operate efficiently in that a relatively large amount of force may be generated for a relatively low amount of power. As will be understood by those skilled in the art, however, the need to maintain a relatively small gap 108 is not conducive to a relatively long travel in a transverse direction for a component such as a stage (not shown) that is to be moved using CI-core actuator 100.

Current may be provided through coil 106 such that a magnetic flux is generated with respect to C-core 102. The flux effectively penetrates gap 108 to create an attraction between C-core 102 and I-core 104. An attraction force, F, may be defined as follows:

$$F \approx \frac{N^2 i^2 A \mu_o}{4(\text{gap})^2} = k \frac{i^2}{(\text{gap})^2}$$

where N is the number of turns of coil 106, i is the current flowing through coil 106, A is an area of one side of C-core 102, $\mu_o$ is the permeability of air, and (gap) represents the size of gap 108. The attraction force is generally more efficient for relatively a relatively small gap 108. When C-core 102 and I-core 104 are formed from a relatively high permeability iron material, the reluctance of the overall magnetic circuit is dominated by the reluctance across gap 108. However, the reluctance of the overall magnetic circuit is affected by the iron material in that the iron causes the overall magnetic path length to increase.

Figure 1B:
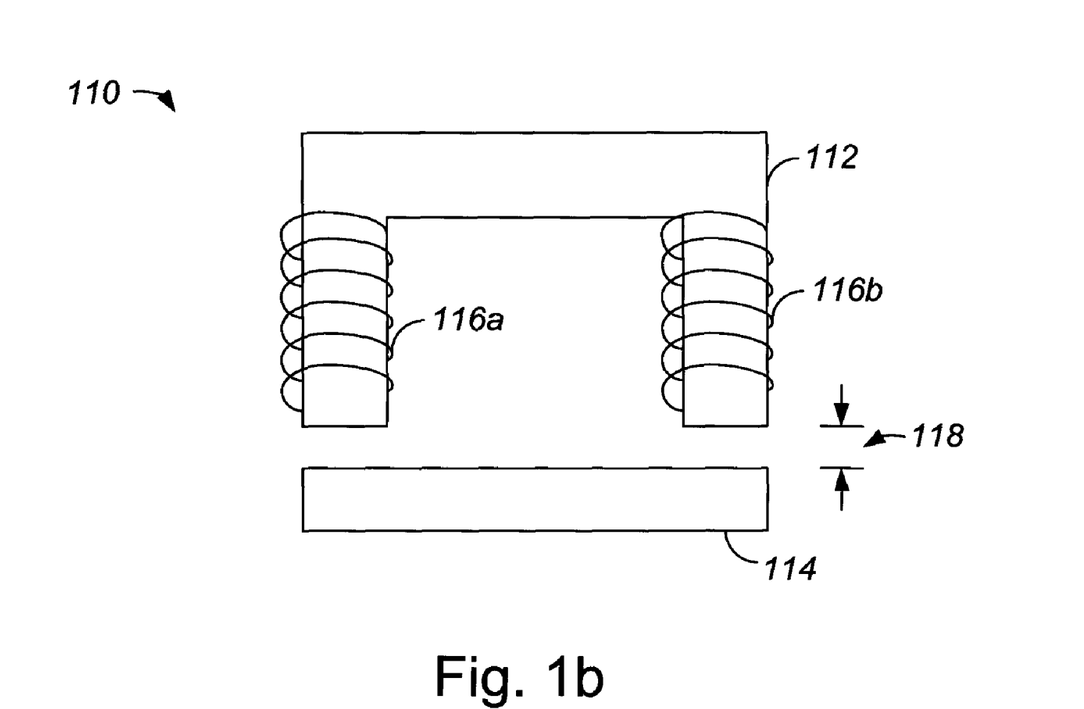
FIG. 1b is a diagrammatic representation of a CI-core actuator with a plurality of coils.

Instead of coil 106 being substantially wound around a top portion of C-core 102, a plurality of coils may instead be wound around "legs" of a C-core. The winding of coils around the legs of a C-core is less complicated to manufacture than the winding of a coil around a top portion of a C-core. FIG. 1b is a diagrammatic representation of a CI-core actuator with a plurality of coils. A CI-core actuator 110 includes a C-core 112 and an I-core 114 which are separated by a gap 118. Coils 116 are wound around sides of C-core 116 as shown.

Figure 1C:
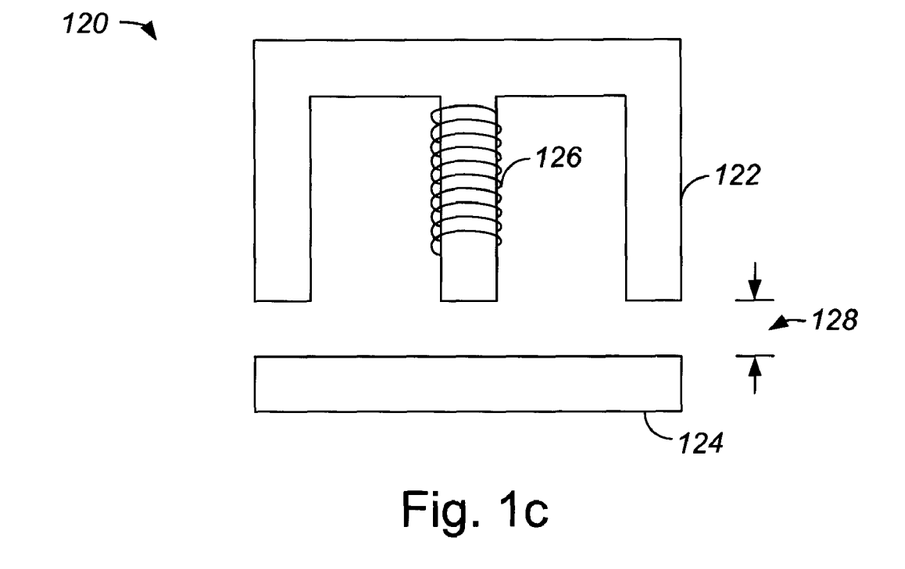
FIG. 1c is a diagrammatic representation of an EI-core actuator with a single coil which is capable of generating a force that may be used as a magnetic levitation force.

While CI-core actuators are often used in magnetic levitation stage devices, EI-core actuators may be used as well. With reference to FIG. 1c, an EI-core actuator will be described. An EI-core actuator 120 generally includes an E-core 122 and an I-core 124 which are separated by a gap 128. A coil 126 may be wound around a "leg" of E-core 122, as shown, such that when current passes through coil 126, flux is substantially generated to cause an attraction between E-core 122 and I-core 124. As CI-core and EI-core actuators provide attractive forces, they are commonly arranged in opposing pairs.

Figure 2A:
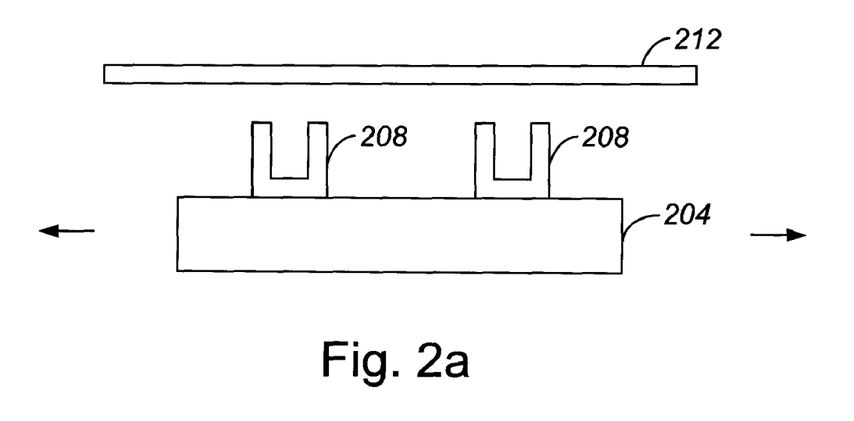
FIG. 2a is a diagrammatic side-view representation of a stage which carries a plurality of C-cores of a CI-core.

CI-core or EI-core actuators may be used to facilitate movement of a stage, as for example a stage that is a magnetic levitation stage. Typically, at least a plurality of pairs of CI-core or EI-core actuators is used in a magnetic levitation stage apparatus. FIG. 2a is a diagrammatic side-view representation of a stage which carries a plurality of C-cores of a CI-core. A stage 204 includes a plurality of C-cores 208, and is arranged to move beneath a relatively large plate 212 which serves as an I-core that corresponds to C-cores 208. Such movement may be accomplished using linear motors. Since C-cores 208 are supporting weight at all times, relatively significant heat may be generated, and coolant is generally needed to provide cooling to stage 204. Further, when C-cores 208 move, substantially any wires or cables (not shown) coupled to C-cores 208 or to coils (not shown) wound around C-cores 208 must also move. Such wires and cables include power cables and cooling hoses. Wire and cables add disturbance forces to stage 204 which may adversely affect the movement and positioning performance of stage 204.

In addition, when C-cores 208 are supported on stage 204, the overall weight carried or otherwise supported by stage 204 increases. Increasing the weight carried or otherwise supported by stage 204 increases the amount of force needed to drive stage 204 and, hence, the power requirements of stage 204, which is often undesirable.

To reduce power requirements and complications associated with positioning C-cores 208 on stage 204 such that C-cores 208 effectively move with stage 204, C-cores may be substantially fixed to a non-moving portion of an overall stage device. With respect to FIG. 2b, a stage which carries an I-core portion of a CI-core actuator while the C-core portion of the CI-core actuator remains substantially fixed will be described. A stage 224 effectively includes an I-core surface (not shown), and is arranged to scan beneath C-cores 228 which are coupled to a substantially fixed surface 232. While the use of stage 224 which does not include moving coils associated with C-cores 228 substantially eliminates issues associated with the implementation of moving coils, stage 224 generally needs to be larger in a stroke direction than the maximum stroke in the stroke direction. That is, stage 224 is sized such that a dimension of stage 224 along a particular axis is larger than the maximum stroke along that axis. As a result, the size of a stroke which stage 224 may undergo is effectively limited by the size of the stage 224.

Figure 2B:
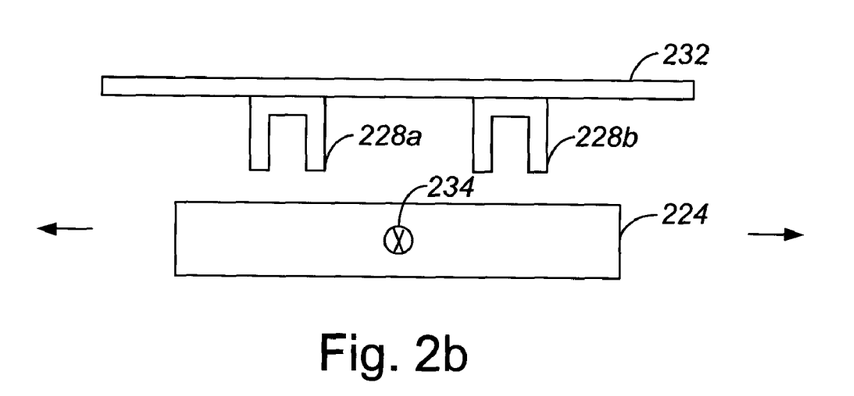
FIG. 2b is a diagrammatic side-view representation of a stage which carries an I-core surface which scans beneath a plurality of C-cores of a CI-core.

Further, the amount of force associated with each C-core 228 typically changes depending upon the location of a center of gravity 234 of stage 224, i.e., a force ratio associated with the force output of each C-core 228 changes. Typically, more force and, hence, more power is required in whichever C-core 228 is nearer to center of gravity 234. In addition, control dynamics generally change with the position of each C-core 228. When center of gravity 234 is located substantially at a mid-line between C-core 228a and C-core 228b, then forces generated using C-core 228a and C-core 228b may be substantially the same. However, when center of gravity 234 is located closer to C-core 228a, for example, then C-core 228a generally must generate more force than C-core 228b. Adjusting the amount of force associated with each C-core 228 depending upon where center of gravity 234 is located is often relatively complicated.

The lifting point associated with a stage also moves when the stage moves. This may cause changing distortion in the stage, which may adversely affect the performance of the stage. When the precision with which the stage may be positioned is affected, wafer fabrication processes which utilize the stage may be compromised.

For at least the reasons stated above, cooling issues and stroke issues associated with the use of CI-core actuators in stage assemblies as discussed with respect to FIGS. 2a and 2b generally do not efficiently allow for relatively long travel transverse to the force direction of the CI-core actuators. Although the use of voice coil motors in a stage apparatus such as a magnetic levitation stage apparatus may be effective in allowing for relatively longer travel in a transverse direction, voice coil motors generally operate less efficiently than CI-core and EI-core actuators. In addition, voice coil motors may either require the use of moving magnets, which add weight to a moving stage, or of moving coils, which gives rise to issues associated with moving cables and cooling.

Therefore, what is needed is a system and a method which enables a stage such as a magnetic levitation stage to have relatively long travel in a transverse direction without significant cooling concerns, stroke length concerns, or issues with moving cables. More specifically, what is desired is a CI-core actuator or an EI-core actuator which allows for long travel in a transverse direction.

SUMMARY OF THE INVENTION

The present invention relates to an actuator which allows for relatively long travel in a transverse direction and is suitable for use in a magnetic levitation stage apparatus. According to one aspect of the present invention, a linear actuator includes a first core, a second core, and at least one coil that is wrapped around the first core. The first core includes a body or yoke portion and a plurality of rails. The body portion has a first axis and a second axis, and the rails each have a longitudinal axis that is perpendicular to the first axis and parallel to the second axis. The dimensions of the rails along the longitudinal axes are substantially larger than a dimension of the body portion along the second axis. The second core has a third axis that is oriented perpendicularly to the longitudinal axes and to the second axis, and is arranged to be suspended or levitated relative to the first core when a current is provided through the coil.

In one embodiment, the linear actuator is a CI-core actuator, and the first core is a C-core and the second core is an I-core. In such an embodiment, the C-core may be formed from layers of magnetically permeable material that are layered with respect to the first axis in the body portion and layered with respect to the longitudinal axes in the rails.

An electromagnetic actuator such as a CI-core actuator or an EI-core actuator with extended rails allows for relatively long travel in a direction transverse to its force. As an I-core of the actuator or motor moves relative to the extended rails, a desired gap distance or a desired magnetic attraction force may be efficiently maintained between the I-core and the C-core. The use of extended rails also enables an I-core to be relatively small while allowing the actuator to have relatively long travel in a transverse direction.

According to another aspect of the present invention, an apparatus includes at least one actuator which has a first core with a body portion with first and second axes, as well as extended rails with longitudinal axes which are perpendicular to the first axis and parallel to the second axis. The actuator also has a coil and a second core. The apparatus further includes a first surface arranged to substantially support the first core, and a stage that supports the second core and is arranged to use the actuator to support the stage weight while the stage translates along a stage axis that is substantially parallel to the longitudinal axes.

In accordance with still another aspect of the present invention, a method for forming a CI-core actuator with extended rails includes binding a plurality of substantially H-shaped laminated layers of a material together using an adhesive, and positioning a coil about a mid-portion or yoke area of the bound layers. Finally, the method includes applying a moment to the bound layers to form a C-core of the CI-core actuator. Applying the moment causes a longitudinal axis of a first leg and a longitudinal axis of second leg of the bound layers to be substantially parallel to each other in a first plane while the mid-portion of the bound laminated layers is not in the first plane. In one embodiment, the laminated layers are formed from ferrite or iron. In another embodiment, the H-shaped layers may be laminated substantially as moments are being applied.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

While efficient in that they provide a relatively large amount of force using relatively low power, conventional CI-core and EI-core actuators generally are not practical for use in allowing for relatively long travel in a transverse direction. The inability to use CI-core and EI-core actuators to allow for relatively long travel in a transverse direction may cause stage designs which use such actuators to be limited.

A CI-core actuator or an EI-core actuator with extended rails, or transverse extensions coupled substantially perpendicularly to legs of the actuator, provides efficient lifting force while allowing relatively long travel in a transverse direction. When an I-core moves relative to the extended rails, a desired gap distance may be fairly readily maintained between the I-core and the C-core by controlling the current to the coil. Herein and after, although an actuator will generally be described as a CI-core actuator for ease of discussion, it should be appreciated that an actuator may also be an EI-core actuator or, more generally, any suitable electromagnetic actuator. The use of extended rails also enables an I-core to be relatively small while allowing the actuator to have relatively long travel in a transverse direction.

A C-core with extended rails generally uses coils as a stator. As a result, there is substantially no heat generated on a stage that is moved using a CI-core actuator. The use of a CI-core actuator with extended rails allows electromagnetic targets associated with a stage to be relatively small, thereby effectively eliminating changing loads associated with the stage. The electromagnets themselves may have a relatively large area to allow for relatively long strokes in a transverse direction.

A CI-core actuator which includes a C-core with extended rails will be described with respect to FIGS. 3a and 3b. A CI-core actuator 300 includes a C-core 302 which is made up of a plurality of rails 302a, 302c, or elongated legs, and a body portion 302b. As shown, body portion 302b is effectively a yoke that includes two body legs and a top body portion about which a coil 306 may be wound. It should be appreciated that in lieu of coil 306 being wound around the top portion of body portion 302b, separate coils may instead be wound around the legs of body portion 302b. Additionally, three coils may be wound around the top and the legs of body portion 302b.

An I-core 310 is arranged under rails 302a, 302c at a distance 320 along a z-axis 330c from rails 302a, 302c. When current is provided to coil 306, a force 334 is generated that effectively enables distance or gap 320 to be maintained between C-core 302 and I-core 310. Typically, the magnitude of distance or gap 320 may be controlled by varying force 334, e.g., an increase in the amount of force 334 will generally cause the size of distance or gap 320 to decrease. Force 334, which is a magnetic attraction force, may be substantially directly measured using a load cell (not shown) coupled to I-core 310 or, alternatively, distance or gap 320 may be measured and controlled substantially directly.

Rails 302a, 302c are arranged to have dimensions along a y-axis 330a that are substantially longer than dimensions along an x-axis 330b and z-axis 330c. Body portion 302b is coupled to rails 302a, 302c such that the long dimensions of rails 302a, 302c along y-axis 330a are substantially longer than all dimensions of body portion 302b relatively to y-axis 330a. As shown, a dimension of body portion 302b with respect to x-axis 330b is longer than dimensions of body portion 302b with respect to y-axis 330a. In the described embodiment, longitudinal axes (not shown), e.g., axes that are parallel to y-axis 330a, of rails 302a, 302c are located in an xy-plane which is substantially parallel to an xy-plane defined through a longitudinal axis, e.g., an axis that is parallel to x-axis 330b, of the top portion of body portion 302b.

Figure 3A:
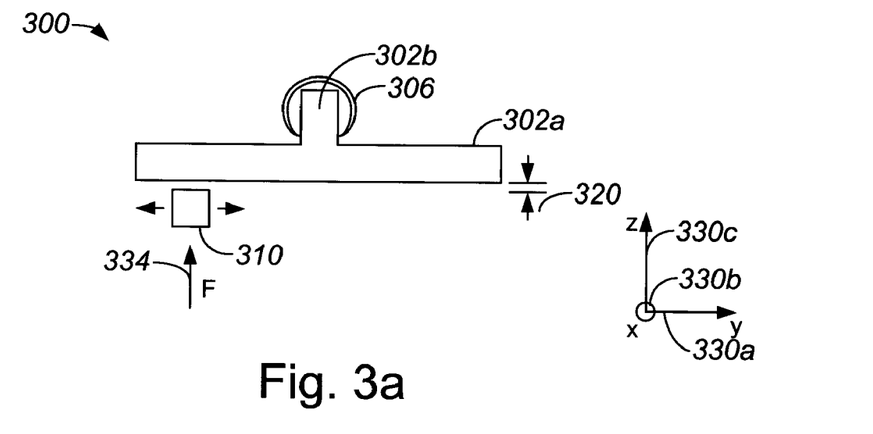
FIG. 3a is a diagrammatic side-view representation of a CI-core actuator with extended rails in accordance with an embodiment of the present invention.
Figure 3B:
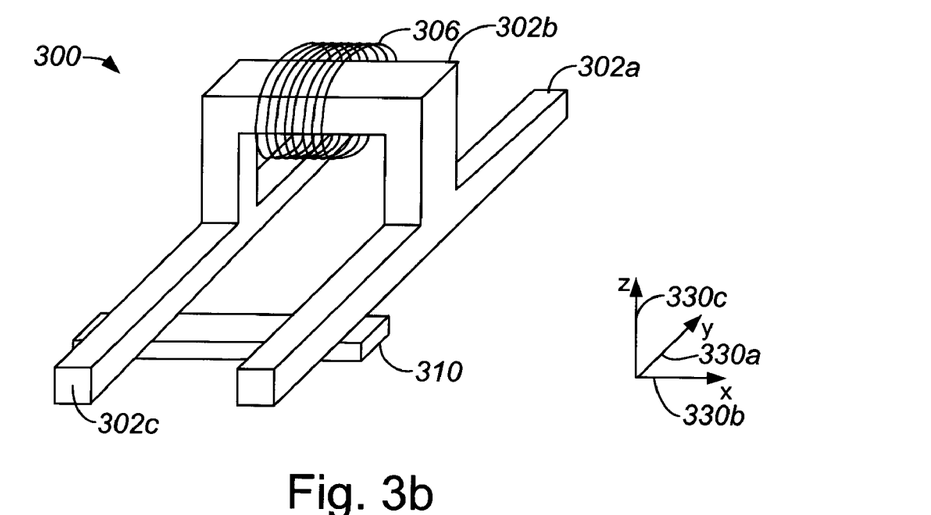
FIG. 3b is a diagrammatic three-dimensional representation of a CI-core actuator with extended rails, i.e., CI-core actuator 300 of FIG. 3a, in accordance with an embodiment of the present invention.

The flux path through a CI-core actuator such as CI-core actuator 300 of FIGS. 3a and 3b varies depending upon where I-core 310 is positioned relative to coil 302b. For instance, when I-core 310 is positioned relatively far away from coil 306, as shown, the flux path through C-core 302 and I-core 310 is longer than the flux path through C-core 302 and I-core 310 when I-core is positioned substantially below coil 306 relative to z-axis 330c. This increase in the flux path is due in part to the magnetic permeability associated with I-core 310. Hence, if a current through coil 306 and gap 320 remains constant, then force 334 changes as a function of the position of I-core 310 with respect to y-axis 330a.

Figure 4:
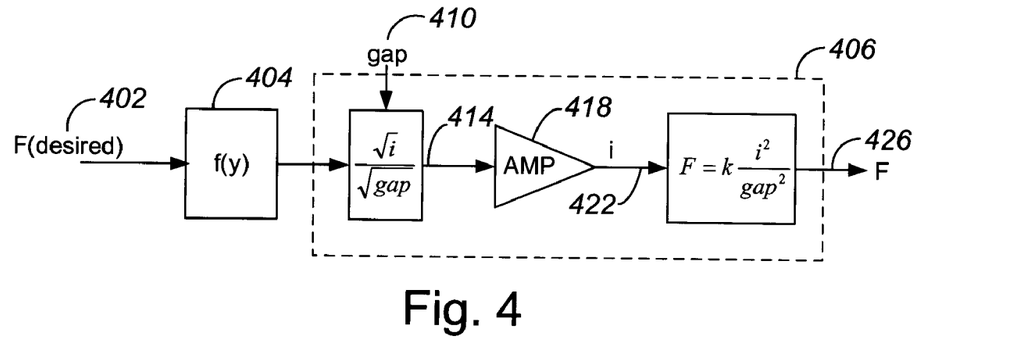
FIG. 4 is a block diagram representation of a control algorithm which may be used to control the attraction force which effectively keeps a C-core and an I-core of a CI-core actuator substantially separated by a desired distance in accordance with an embodiment of the present invention.

It is generally desirable for force 334 to be maintained at a substantially constant level, irregardless of whether I-core 310 may be positioned relative to coil 306. By maintaining force 334 at a substantially constant level, a stage (not shown) which is coupled to I-core 310 may operate in a desired manner and effectively be held at a desired distance from C-core 302. The weight of the stage is constant, hence force is efficiently provided to maintain the desired distance with substantially predictable relatively high bandwidth servo control of a position relative to z-axis 330c. A desired force may be provided to a control system (not shown) which controls the amount of current provided to coil 306. FIG. 4 is a block diagram representation of a control algorithm which may be used to control the attraction force which effectively keeps a C-core and an I-core of a CI-core actuator substantially separated by a desired distance in accordance with an embodiment of the present invention. A desired force input 402 is provided to an arrangement 406 which may include a controller and a CI-core actuator. In one embodiment, desired force input 402 is calibrated using a calibration factor 404 that is a function of a y-position before desired force input 402 is provided to arrangement 406. A gap distance input 410, e.g., an input that corresponds to a distance 320 between a C-core 302 and an I-core 310 as shown in FIG. 3a, is also provided as an input to arrangement 406. Desired force input 402 and gap input 410 are used to effectively determine a current input 414 to an amplifier 418 of arrangement 406 that is necessary to provide an output force 426 which is approximately equal to a desired force, i.e., a force which corresponds to desired force input 402. Amplifier 418 effectively provides a current 422 to a coil, e.g., coil 306 of FIG. 3a. Current 422 is arranged to effectively cause the CI-core actuator to produce force 426 that effectively causes an I-core to be pulled or attracted towards a C-core.

Force 426 is a function of current 422 and gap distance input 410. Hence, the magnitude of force 426 may be controlled by controlling current 422. If the size of a gap between a C-core and an I-core varies, then in order for force 426 to remain at approximately the same magnitude as a desired force, current 422 provided to a coil may be adjusted. Similarly, if a desired force varies, then current 422 may vary such that force 426 may be approximately equal to the desired force. In one embodiment, a "gain commutation curve," which may be used to determine a gap distance input 410 and an amount of current 422 needed to enable force 426 to be substantially equal to desired force input 402 at each location of an I-core, may be calibrated when a stage device which uses a CI-core actuator is set up. Similarly, a different gain commutation curve may be calibrated to facilitate the determination of what current 422 may be needed to maintain a particular gap at each location of an I-core relative to a y-axis and a z-axis. In other words, current 422 may effectively be adjusted as a function of a gap and a y-position in order to keep force 426 substantially constant while the gap distance changes.

As shown in FIGS. 3a and 3b, a C-core of a CI-core actuator may be formed from a plurality of rails and a body portion which is substantially C-shaped. However, the shape of the body portion may be substantially any suitable shape as long as sufficient space is provided between a bottom surface of the body portion and a bottom surface of the plurality of rails to enable a coil to be positioned about the body portion. For an embodiment in which a cooling arrangement is arranged around the coil, sufficient space is also substantially required between the bottom surface of the body portion and the bottom surface of the plurality of rails to provide clearance for both the coil and the cooling arrangement.

Figure 5:
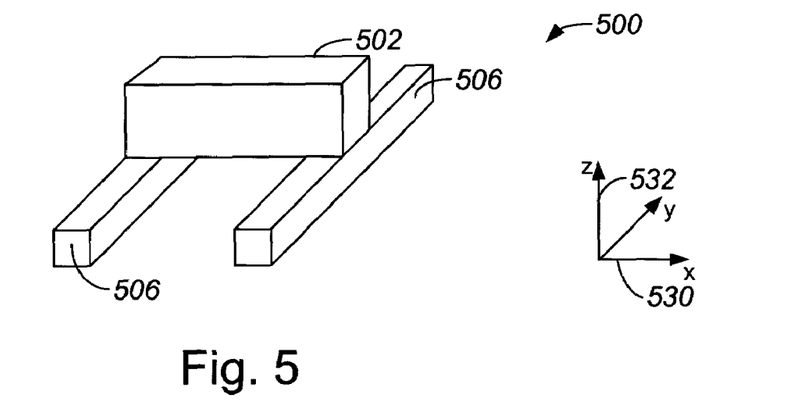
FIG. 5 is a diagrammatic representation of a C-core with a body portion that is a substantially rectangular block in accordance with an embodiment of the present invention.

FIG. 5 is a diagrammatic representation of a C-core with a body portion that is a substantially rectangular block in accordance with an embodiment of the present invention. A C-core 500 includes a body portion 502 or a yoke which is coupled to rails or elongated legs 506. Body portion 502 is a substantially rectangular block, and is arranged for a coil (not shown) to be positioned about body portion 502 such that the coil is effectively oriented about an x-axis 530. As long as the coil (not shown) does not extend below a bottom surface of rails 506 relative to a z-axis 532, then C-core 502 may be efficiently used as a part of an overall CI-core actuator.

Figure 6A:
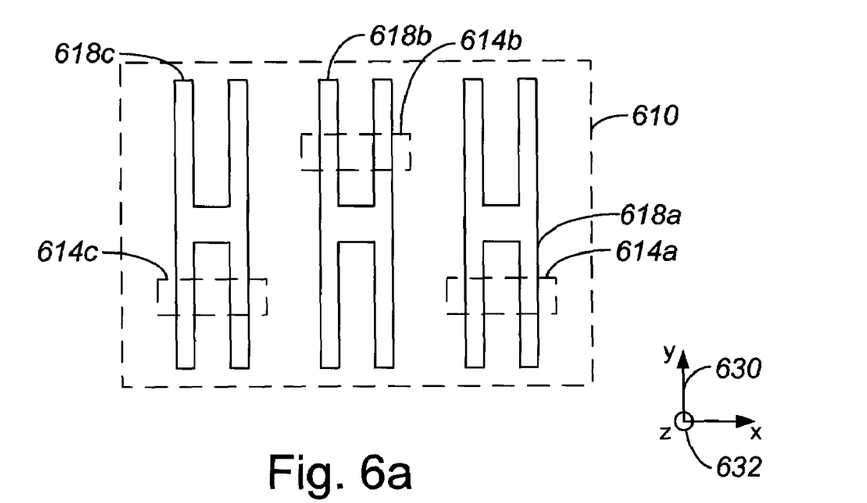
FIG. 6a is a diagrammatic top-view representation of a stage arrangement which includes a plurality of CI-core actuators with extended rails in accordance with an embodiment of the present invention.
Figure 6B:
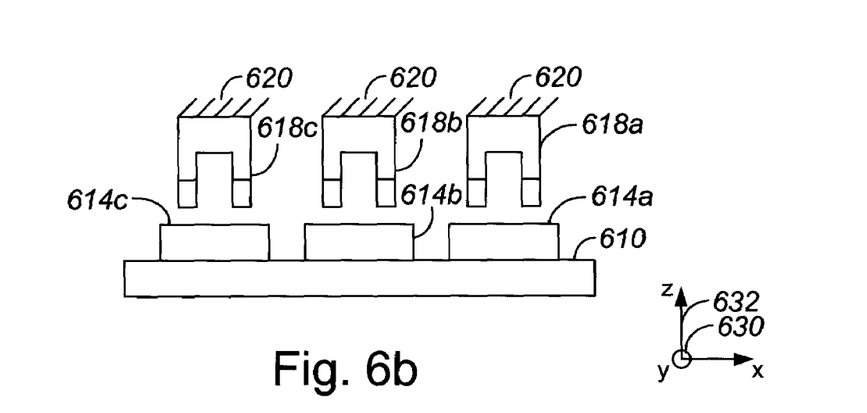
FIG. 6b is a diagrammatic side-view representation of a stage arrangement which includes a plurality of CI-core actuators with extended rails, i.e., the stage arrangement of FIG. 6a, in accordance with an embodiment of the present invention.

A CI-core actuator with rails or elongated legs may be positioned such that the C-core of the actuator is held to a substantially fixed surface, while the I-core of the actuator is positioned on a stage, e.g., a magnetic levitation stage. In general, a stage may have three associated CI-core actuators. With reference to FIGS. 6a and 6b, the use of CI-core actuators with extended rails within a stage device will be described in accordance with an embodiment of the present invention. A stage 610, which may be arranged to support a wafer (not shown), is coupled to a plurality of I-cores 614 which are associated with C-cores 618 that are supported on a surface 620 that is substantially fixed relative to stage 610. Stage 610 is arranged to move along a y-axis 630a, i.e., stage 610 has a stroke along y-axis 630. Since extended rails of stage 610 are aligned along y-axis 630, C-cores 616 and I-cores 614 effectively cooperate to provide stage 610 with relatively long travel in a transverse direction.

In the described embodiment, when magnetic levitation of stage 610 is desired with respect to a z-axis 632, stage 610 may be associated with approximately three CI-core actuators, namely a CI-core actuator that includes C-core 618a and I-core 614a, another CI-core actuator that includes C-core 618b and I-core 614b, and yet another CI-core actuator that includes C-core 618c and I-core 614c. It should be appreciated, however, that more than three CI-core actuators may be used to enable levitation and control of stage 610 with respect to z-axis 632, and to effectively control any pitching and the rolling of stage 610.

The material used to form a C-core with extended or elongated rails is generally a material such as iron, ferrite, or any suitable magnetically permeable material. Although a C-core may be formed from a single block of solid material or a plurality of blocks of solid material with a coil wound around a yoke of the C-core, in order to reduce eddy currents in the C-core, laminated layers of material may be used to form C-core. The use of layered material which are typically held together using an adhesive material reduces the occurrence of eddy currents and, hence, increases the efficiency of C-core, as will be appreciated by those skilled in the art.

Figure 7A:
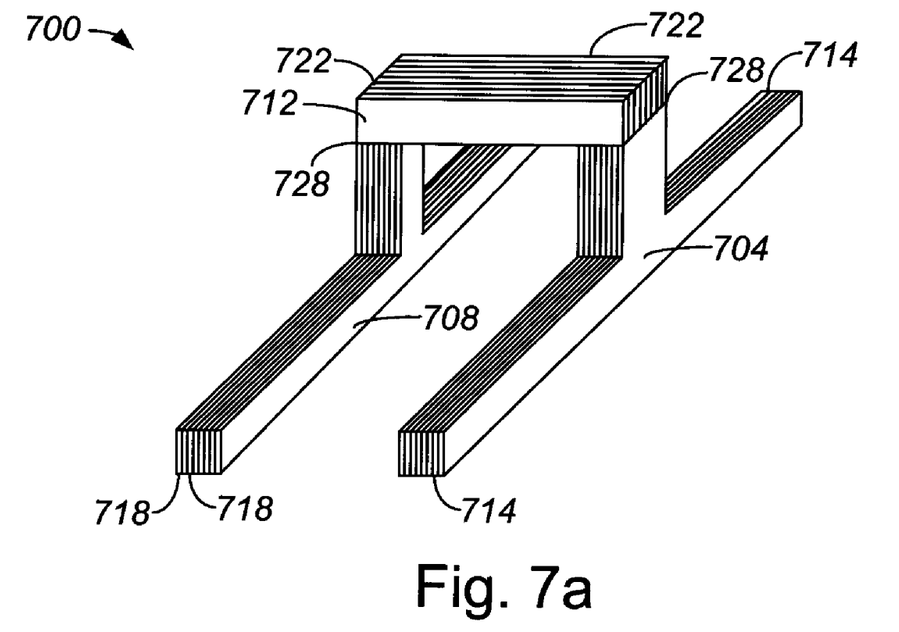
FIG. 7a is a diagrammatic representation of a C-core which is formed from a plurality of blocks of laminated layered material in accordance with an embodiment of the present invention.

A C-core may be formed from three "blocks" of laminated layered material. FIG. 7a is a diagrammatic representation of a C-core which is formed from a plurality of blocks of laminated layered material in accordance with an embodiment of the present invention. A C-core 700 may include a first extended rail and yoke leg block 704, and a second extended rail and yoke leg block 408. Also included in C-core 700 may be a yoke body block 712. Laminated layers 714 may be adhered together to from block 704, while laminated layers 718 may be adhered together to form block 708. Similarly, laminated layers 722 may be adhered together to form block 712. In one embodiment, the orientations of laminated layers 714 in block 704 and laminated layers 718 in block 708 are such that the reluctance within C-core 700 may be substantially minimized.

A coil (not shown) may be wound about block 712 prior to coupling block 712 to blocks 704, 708, or coils (not shown) may be would around yoke legs of blocks 704, 708 prior to coupling block 712 to blocks 704, 708. Hence, C-core 700 may be relatively easy to assemble. At junctions 728 between block 722 and each of blocks 704, 708, laminated layers 722 and laminated layers 714, as well as laminated layers 722 and laminated layers 718, respectively, criss-cross when block 712 is coupled to blocks 704, 708. Hence, there may be a relatively small loss of efficiency associated with flux paths though junctions 728. In order to substantially eliminate a loss of efficiency associated with flux paths through junctions 728, junctions 728 may be substantially eliminated by forming a C-core from a single block of laminated layers.

Figure 7B:
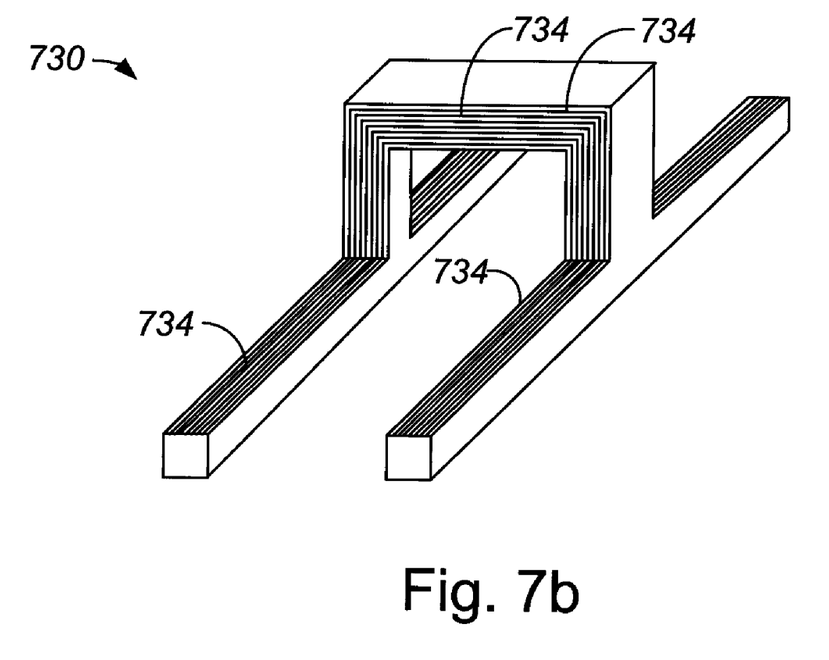
FIG. 7b is a diagrammatic representation of a C-core which is formed from a block of laminated layered material in accordance with an embodiment of the present invention.

FIG. 7b is a diagrammatic representation of a C-core which is formed from a block of laminated layered material in accordance with an embodiment of the present invention. A C-core 730 is formed from laminated layers 734 which are initially substantially H-shaped. That is, laminated layers 734 may be strips of material that are substantially H-shaped. Once laminated layers 734 are adhered together, and at least one coil (not shown) is positioned around a top or around legs of a yoke portion of C-core 730, laminated layers 734 may be bent through the application of forces or moments to create a desired shape for C-core 730. By forming C-core 730 from a single block of laminated layers 734, any inefficiencies associated with a junction between laminated layers of different blocks may effectively be eliminated. However, the positioning of a coil (not shown) around a portion of C-core 730 may be complicated.

Figure 7C:
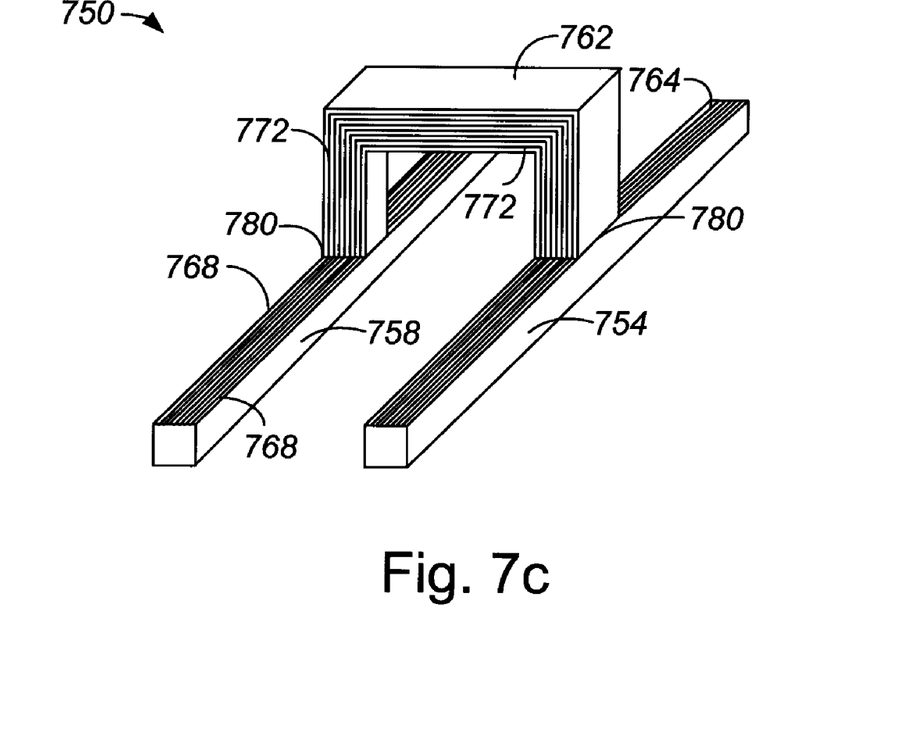
FIG. 7c is a diagrammatic representation of a C-core which is formed from a plurality of blocks of laminated layered material in which a yoke portion of the C-core is formed from a substantially single block in accordance with an embodiment of the present invention.

To facilitate the positioning of a coil about a portion of a body portion or a yoke of a C-core without a significant loss of efficiency at junctions between different blocks of laminated layered material of the C-core, the body portion or yoke of the C-core may be formed from a single block, while extended rails may be formed from single blocks as shown in FIG. 7c. A C-core 750, like C-core 700 of FIG. 7a, includes three blocks 754, 758, 762. However, C-core 750 has an overall yoke, i.e., a body portion or a bridge, that is formed from single block 762 of laminated layers 772, while block 754 of laminated layers 764 and block 758 of laminated layers 768 for substantially only extended rails.

A coil or coils (not shown) may be wound around body 762 prior to coupling body 762 to bodies 754, 758. Since laminated layers 772 are effectively aligned along the same planes as laminated layers 764, 768 at junctions 780, any loss of efficiency in the flux paths at junctions 780 may be relatively insignificant. It should be appreciated that the location of coils may vary. In one embodiment, coils (not shown) may be wound around legs of body 762.

Figure 8:
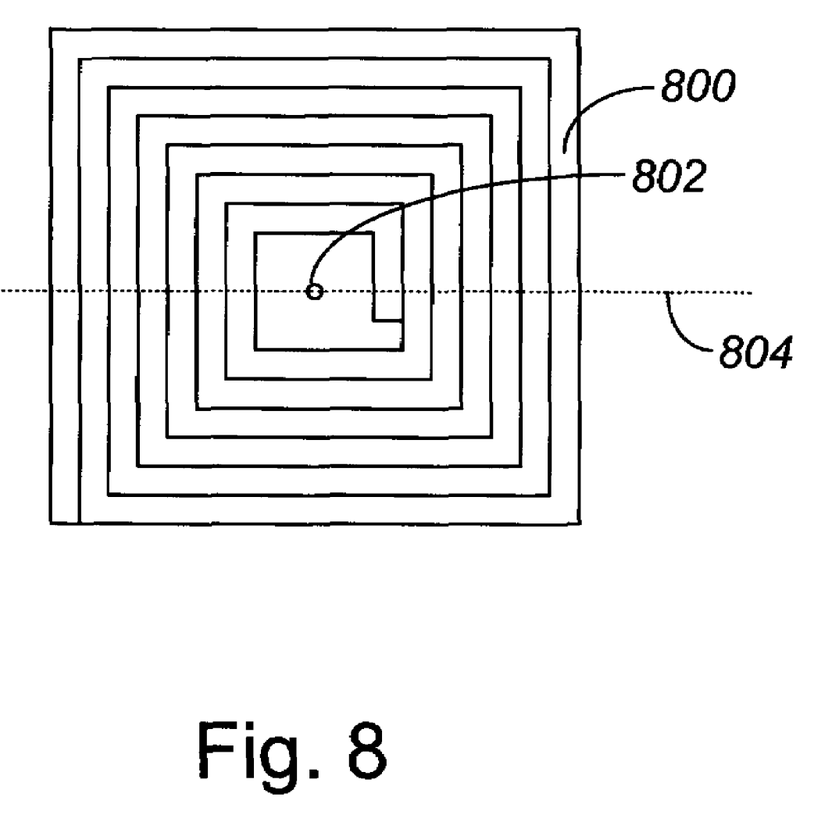
FIG. 8 is a diagrammatic representation of a wound strip of laminated material which is suitable for use in forming a yoke portion of a C-core in accordance with an embodiment of the present invention.

While laminated layers 772 may be formed into block 762 substantially by bending strips of material, as for example, strips of magnetically permeable material, laminated layers 772 may be more efficiently formed by winding a relatively large single strip of material, then cutting the wound material to form block 762. In general, laminate layers 772 may be bent before being laminated, while being laminated, or after being laminated. As shown in FIG. 8, a flat strip 800 of laminated material may be wound about a center point 802. When the winding of flat strip 800 of laminated material is substantially completed, flat strip 800 may be cut along a centerline 804 to form a block of laminated layers such as block 762 of FIG. 7c.

Figure 7D:
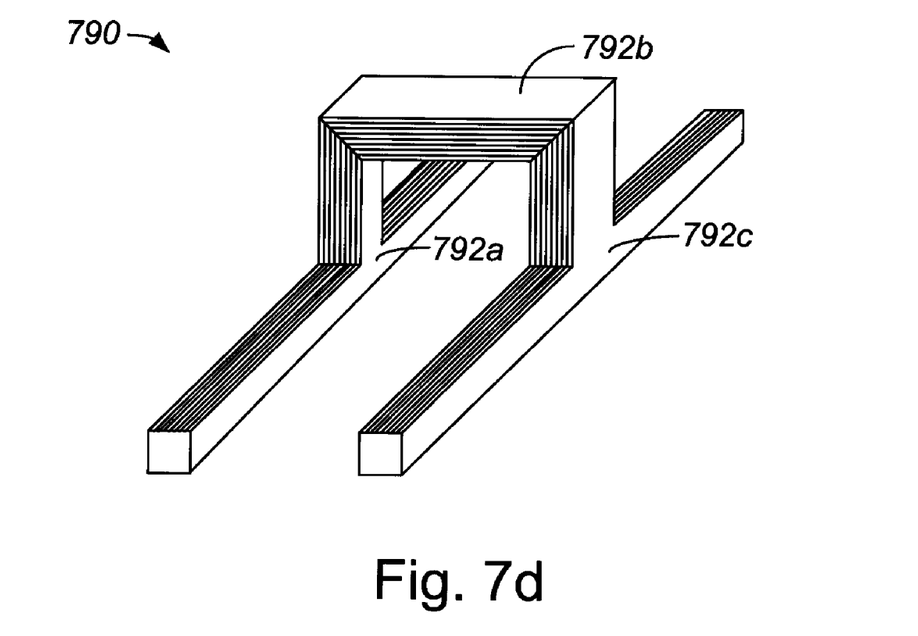
FIG. 7d is a diagrammatic representation of a C-core which is formed from a plurality of blocks of laminated layered material in which a yoke portion of the C-core is formed from separate blocks in accordance with an embodiment of the present invention.

Any number of blocks may generally be used to form a C-core. As shown in FIG. 7d, a C-core 790 has may be formed from approximately three separate blocks 792a-c, namely a top block 792b that is arranged to substantially bridge a first block 792a and a second block 792c. Block 792b has slanted edges, or edges cut along a diagonal, that are arranged to match up with edges of blocks 792a, 792c. That is, the laminated layers of C-core 790 are arranged to substantially match along diagonal edges.

Figure 9:
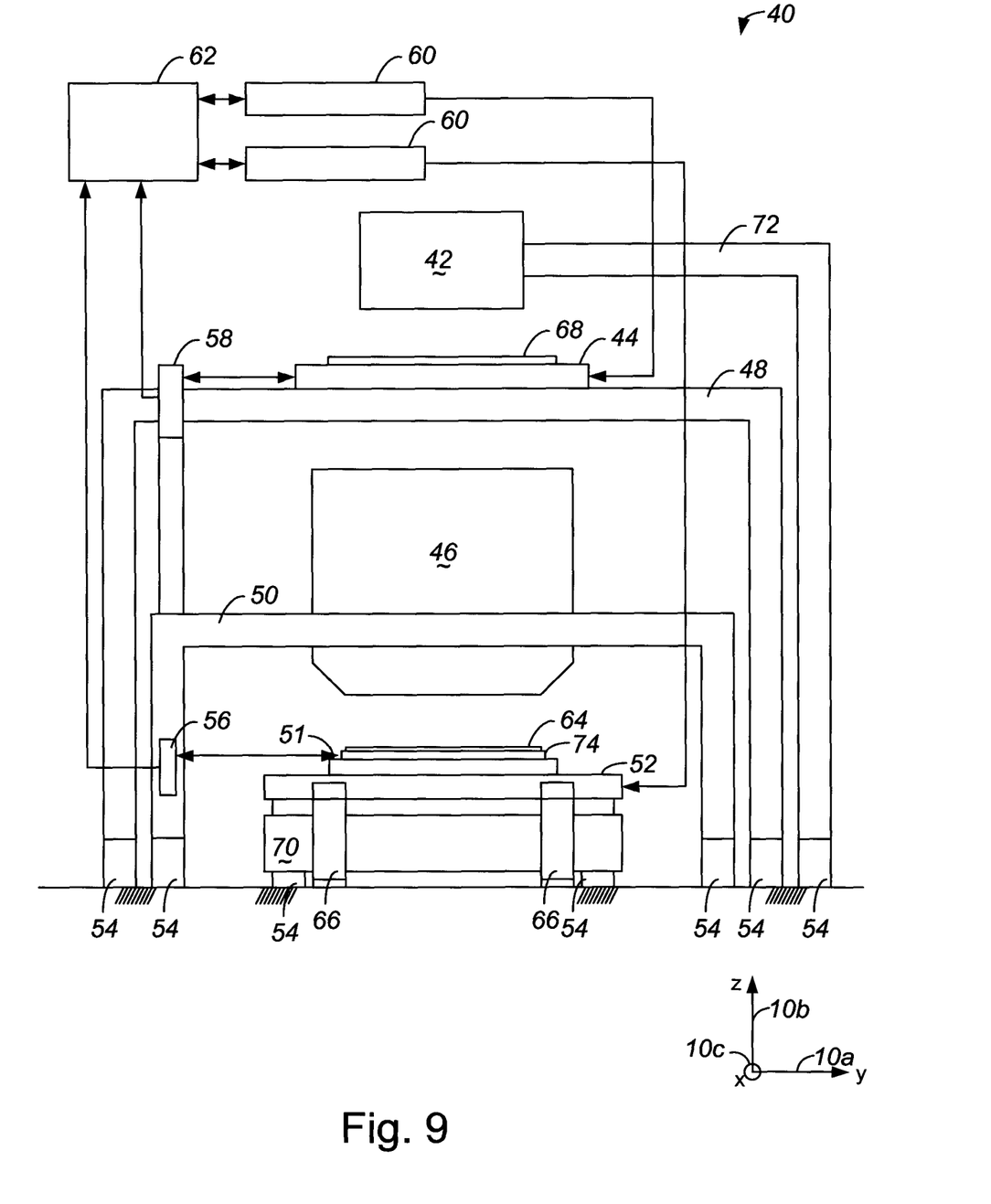
FIG. 9 is a diagrammatic representation of a photolithography apparatus in accordance with an embodiment of the present invention.

With reference to FIG. 9, a photolithography apparatus which may include a vacuum-compatible wafer stage arrangement will be described in accordance with an embodiment of the present invention. It should be appreciated that although a vacuum-compatible wafer stage arrangement has been described as being suitable for use as a part of an EUV lithography system, such a stage may generally be used as a part of substantially any suitable photolithography apparatus. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator, e.g., an EI-core actuator with a top coil and a bottom coil which are substantially independently controlled. The planar motor which drives wafer positioning stage 52 generally uses an electromagnetic force generated by magnets and corresponding armature coils arranged in two dimensions. A wafer 64 is held in place on a wafer holder or chuck 74 which is coupled to wafer table 51. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In one described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, which may provide a beam of EUV light that may be reflected off of a reticle. In one embodiment, illumination system 42 may be arranged to project a radiant energy, e.g., light, through a mask pattern on a reticle 68 that is supported by and scanned using a reticle stage 44 which includes a coarse stage and a fine stage. It should be appreciated that for such an embodiment, photolithography apparatus 40 may be a part of a system other than an EUV lithography system. In general, a stage with isolated actuators may be used as a part of substantially any suitable photolithography apparatus, and is not limited to being used as a part of an EUV lithography system. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Further, the present invention may be utilized in an exposure apparatus that comprises two or more substrate and/or reticle stages. In such an apparatus, e.g., an apparatus with two substrate stages, one substrate stage may be used in parallel or preparatory steps while the other substrate stage is utilizes for exposing. Such a multiple stage exposure apparatus is described, for example, in Japan patent Application Disclosure No. 10-163099, as well as in Japan patent Application Disclosure No. 10-214783 and its U.S counterparts, namely U.S. Pat. No. 6,341,007, U.S. Pat. No. 6,400,441, U.S. Pat. No. 6,549,269, U.S. Pat. No. 6,590,634. Each of these Japan patent Application Disclosures and U.S. patents are incorporated herein by reference in their entireties. A multiple stage exposure apparatus is also described in Japan patent Application Disclosure No. 20000-505958 and its counterparts U.S. Pat. No. 5,969,441 and U.S. Pat. No. 6,208, 407, each of which are incorporated herein by reference in their entireties.

The present invention may be utilized in an exposure apparatus that has a movable stage that retains a substrate (wafer) for exposure, as well as a stage having various sensors or measurement tools, as described in Japan patent Application Disclosure No. 11-135400, which is incorporated herein by reference in its entirety. In addition, the present invention may be utilized in an exposure apparatus that is operated in a vacuum environment such as an EB type exposure apparatus and an EUVL type exposure apparatus when suitable measures are incorporated to accommodate the vacuum environment for air (fluid) bearing arrangements.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolators such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 10:
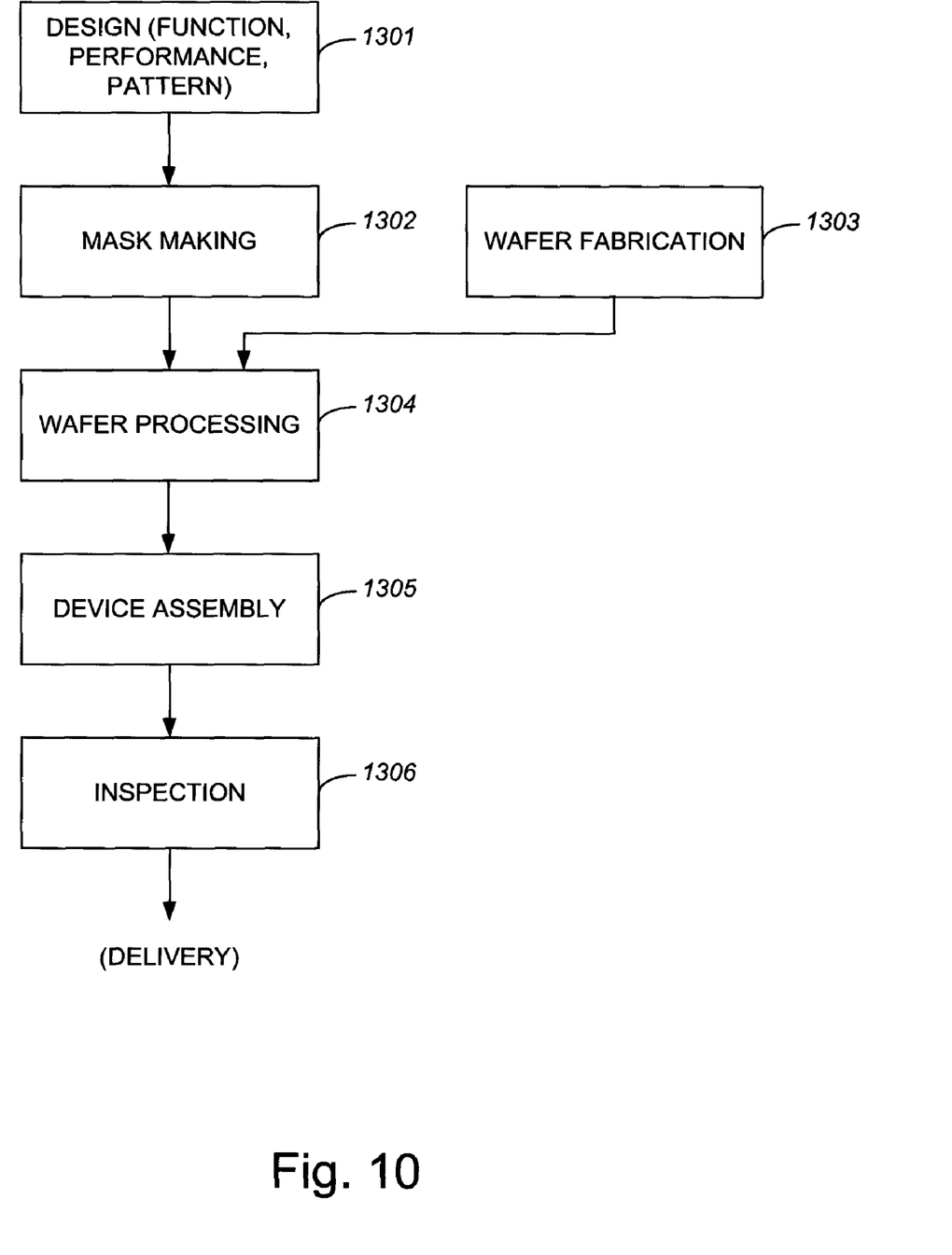
FIG. 10 is a process flow diagram which illustrates the steps associated with fabricating a semiconductor device in accordance with an embodiment of the present invention.

Further, semiconductor devices may be fabricated using systems described above, as will be discussed with reference to FIG. 10. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 11. In step 1305, the semiconductor device is assembled. The assembly of the semiconductor device generally includes, but is not limited to, wafer dicing processes, bonding processes, and packaging processes. Finally, the completed device is inspected in step 1306.

Figure 11:
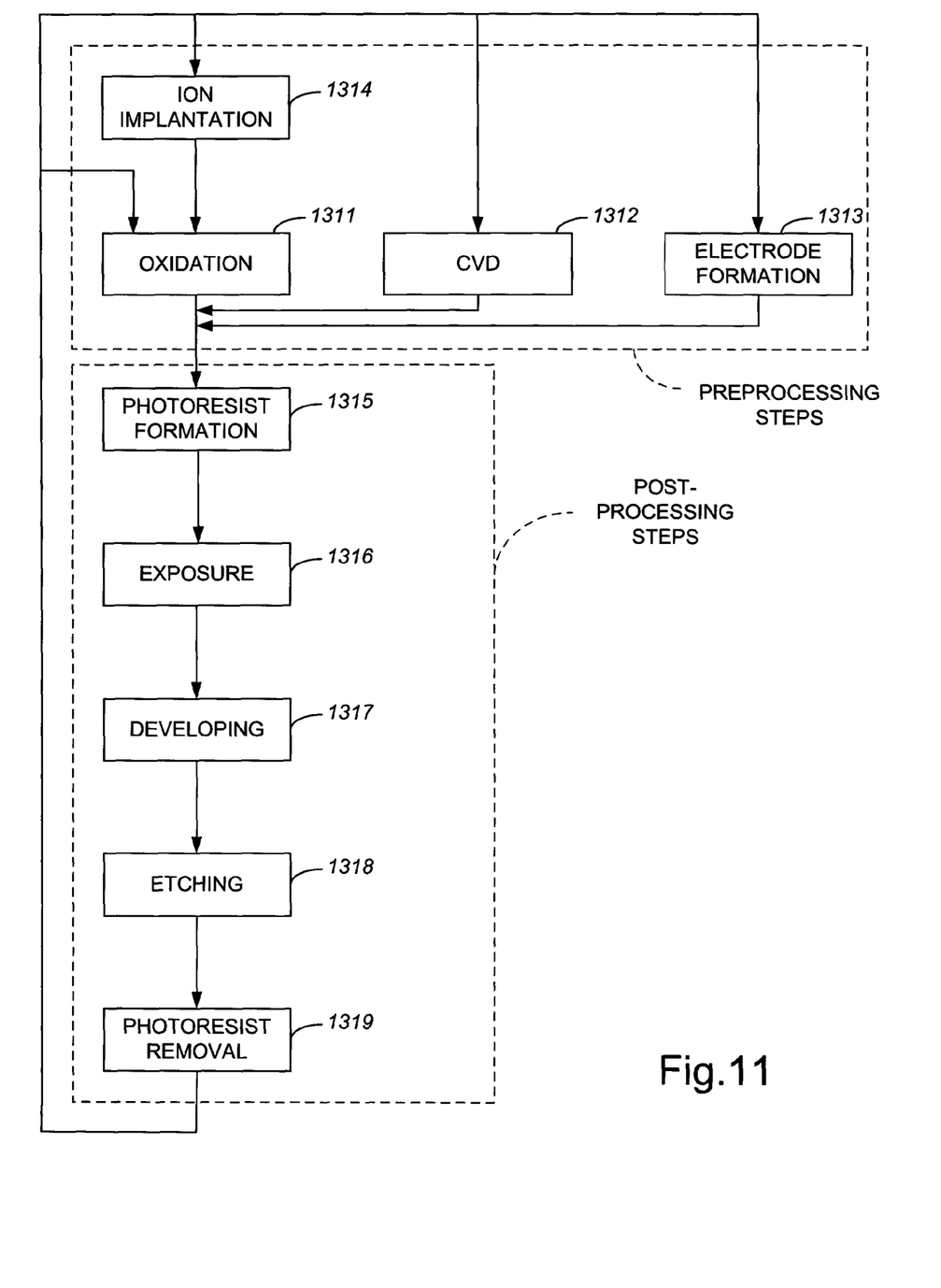
FIG. 11 is a process flow diagram which illustrates the steps associated with processing a wafer, i.e., step 1304 of FIG. 10, in accordance with an embodiment of the present invention.

FIG. 11 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, a CI-core actuator with extended rails may be used as a part of a magnetic levitation stage, as discussed above, or as a part of any other suitable stage. In addition, a CI-core actuator with extended rails may be used as a part of substantially any application in which relatively long-travel in a transverse direction may be desired.

The formation of a C-core has been described as being formed from a single block of solid material or laminated layers of material, or three blocks of solid material or laminated layers of material. The number of blocks from which a C-core is formed, however, may vary widely. In one embodiment, a body portion or a yoke of a C-core may be formed from approximately three blocks, while extended rails are formed from two separate blocks.

In general, an actuator with extended rails has been described as a CI-core actuator. Specifically, a portion of an actuator which includes two extended rails has been described as being a C-core that is a part of a CI-core actuator. It should be understood, however, that an EI-core actuator may also have a number of extended rails, e.g., three extended rails. Further, an EI-core actuator with extended rails may be used, as for example as a part of a stage device, in substantially any application in which a CI-core actuator with extended rails may be used.

Configurations other than a CI-core and an EI-core in an actuator of the present information may be used. For example, CC-core, EE-core, IC core and other configurations may generally be used in which a coil may be placed on a static side of the core. Further, the arrangement of actuators with extended rails may vary. In one embodiment, a pair of actuators may be arranged to provide substantially opposing forces such that gravity is not used to provide a force in a z-direction.

While the use of three or more actuators with extended rails, e.g., CI-core actuators, is effective in allowing the levitation of a stage to be effectively controlled and to reduce any pitching and rolling of the stage, any number of CI-core actuators may be used as a part of a stage device. For instance, a single CI-core actuator with extended rails may be positioned substantially at the center of gravity for a stage, while a plurality voice coil motors may be used in conjunction with the single CI-core actuator. Alternatively, three or more actuators with extended rails may be used in conjunction with any number of other actuators as a part of a stage device. By way of example, a stage device may include three CI-core actuators with extended rails to efficiently provide a gravity offset for the stage device, and three voice coil motors for relatively fine force control. Therefore, the present examples are to be considered as illustrative and not restrictive, and the invention is not to be limited to the details given herein, but may be modified within the scope of the appended claims.

What is claimed is:

1. An electromagnetic actuator comprising:
    a first core, the first core including a body portion and a plurality of rails, the body portion having a first axis and a second axis, the plurality of rails having longitudinal axes which are substantially perpendicular to the first axis and substantially parallel to the second axis, wherein dimensions of the plurality of rails along the longitudinal axes are substantially larger than a dimension of the body portion along the second axis, the first core being formed from a magnetically permeable material;
    at least one coil, the at least one coil being substantially wound around the first core; and
    a second core, the second core having a third axis, the third axis being oriented substantially perpendicularly to the longitudinal axes and to the second axis, wherein the second core is arranged to be substantially suspended relative to the first core at a distance beneath a bottom surface of the plurality of rails when a current is provided through the at least one coil.

2. The electromagnetic actuator of claim 1 wherein the at least one coil is substantially wound around the body portion of the first core.

3. The electromagnetic actuator of claim 1 wherein the first core is formed from layers of magnetically permeable material, the layers of magnetically permeable material being substantially layered with respect to the first axis in the body portion and substantially layered with respect to the longitudinal axes in the rails.

4. The electromagnetic actuator of claim 1 wherein the linear actuator is a CI-core actuator, and the first core is a C-core and the second core is an I-core.

5. The electromagnetic actuator of claim 1 wherein the first core is formed from layers of ferrite, the layers of ferrite being substantially layered with respect to the first axis in the body portion and substantially layered with respect to the longitudinal axes in the rails.

6. The electromagnetic actuator of claim 1 wherein the body portion includes a bottom surface and the plurality of rails include a top surface, the bottom surface of the body portion being coupled to the top surface of the plurality of rails.

7. The electromagnetic actuator of claim 5 wherein the layers of ferrite are arranged as a single block.

8. The electromagnetic actuator of claim 5 wherein the layers of ferrite are arranged as a plurality of blocks.

* * * * *